US011127913B2

(12) United States Patent
Woo et al.

(10) Patent No.: US 11,127,913 B2
(45) Date of Patent: Sep. 21, 2021

(54) QUANTUM-DOT LIGHT EMITTING DIODE AND QUANTUM-DOT LIGHT EMITTING DISPLAY DEVICE

(71) Applicant: LG Display Co., Ltd., Seoul (KR)

(72) Inventors: Sung-Il Woo, Paju-si (KR); Byung-Geol Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/691,224

(22) Filed: Nov. 21, 2019

(65) Prior Publication Data

US 2020/0168827 A1    May 28, 2020

(30) Foreign Application Priority Data

Nov. 23, 2018    (KR) .................. 10-2018-0146371

(51) Int. Cl.
*H01L 51/50* (2006.01)
*H01L 27/32* (2006.01)
*H01L 51/00* (2006.01)

(52) U.S. Cl.
CPC ........ *H01L 51/502* (2013.01); *H01L 27/3244* (2013.01); *H01L 51/508* (2013.01); *H01L 51/5064* (2013.01); *H01L 51/004* (2013.01); *H01L 51/0039* (2013.01); *H01L 51/0043* (2013.01); *H01L 2251/558* (2013.01)

(58) Field of Classification Search
CPC . H01L 51/502; H01L 51/5064; H01L 51/508; H01L 27/3244
See application file for complete search history.

(56) References Cited

U.S. PATENT DOCUMENTS

| | | | |
|---|---|---|---|
| 10,388,902 B1* | 8/2019 | Palles-Dimmock | ........................ H01L 51/5225 |
| 2018/0123070 A1* | 5/2018 | Lee | ...................... G02B 6/0023 |
| 2019/0081262 A1* | 3/2019 | Kim | ........................ C08K 3/22 |
| 2019/0115550 A1* | 4/2019 | Kim | .................... H01L 51/5221 |

* cited by examiner

*Primary Examiner* — Anthony Ho
(74) *Attorney, Agent, or Firm* — Polsinelli PC

(57) ABSTRACT

A quantum-dot light emitting diode includes a first electrode; a second electrode facing the first electrode; a QD emitting material layer between the first and second electrodes and including a QD; a hole transporting layer between the first electrode and the QD emitting material layer and including a first hole transporting material; a first electron transporting layer between the QD emitting material layer and the second electrode; and a first electron control layer between the QD emitting material layer and the first electron transporting layer and including a second hole transporting material.

20 Claims, 4 Drawing Sheets

QUANTUM-DOT LIGHT EMITTING DIODE AND QUANTUM-DOT LIGHT EMITTING DISPLAY DEVICE

CROSS REFERENCE TO RELATED APPLICATION

This application claims priority to and the benefit of Republic of Korea Patent Application No. 10-2018-0146371 filed on Nov. 23, 2018, which is hereby incorporated by reference in its entirety.

BACKGROUND

Field of the Disclosure

The present disclosure relates to a quantum-dot (QD) light emitting diode, and more particularly, to a QD light emitting diode and a QD light emitting display device having improved charge balance.

Description of the Background

Recently, as society has entered in earnest upon an information age, a field of display devices that represent all sorts of electrical signals as visual images has been developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum-dots (QD) to display devices has been researched or studied.

In the QD, an electron in unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

The QD light emitting diode using the QD includes an anode, a cathode facing the anode and a QD emitting layer. The QD emitting layer is disposed between the anode and the cathode and includes the QD. When the hole and the electron are respectively injected from the anode and the cathode into the QD emitting layer, the light is emitted from the QD emitting layer.

However, a charge balance in the QD light emitting diode is degraded such that the emitting efficiency of the QD light emitting diode is decreased.

SUMMARY

Accordingly, the present disclosure is directed to a QD light emitting diode and a QD light emitting display device that substantially obviate one or more of the problems due to limitations and disadvantages of the related art, and have other advantages.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a quantum-dot light emitting diode includes a first electrode; a second electrode facing the first electrode; a QD emitting material layer between the first and second electrodes and including a QD; a hole transporting layer between the first electrode and the QD emitting material layer and including a first hole transporting material; a first electron transporting layer between the QD emitting material layer and the second electrode; and a first electron control layer between the QD emitting material layer and the first electron transporting layer and including a second hole transporting material.

In another aspect, a quantum-dot (QD) light emitting display device includes a substrate; a QD light emitting diode over the substrate, the QD light emitting diode comprising: a first electrode; a second electrode facing the first electrode; a QD emitting material layer between the first and second electrodes and including a QD; a hole transporting layer between the first electrode and the QD emitting material layer and including a first hole transporting material; a first electron transporting layer between the QD emitting material layer and the second electrode; and a first electron control layer between the QD emitting material layer and the first electron transporting layer and including a second hole transporting material; and a thin film transistor between the substrate and the QD light emitting diode and connected to the QD light emitting diode.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings.

Figure 1:
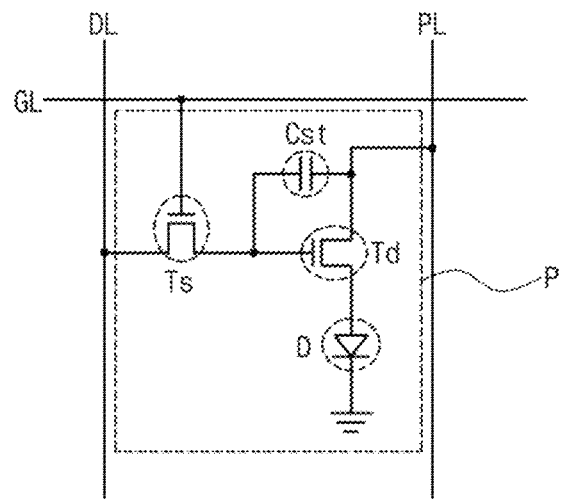
FIG. 1 is a schematic circuit diagram of a QD light emitting display device according to the present disclosure.

FIG. 1 is a schematic circuit diagram of a QD light emitting display device according to the present disclosure.

As shown in FIG. 1, in a QD light emitting display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and a QD light emitting diode D are formed.

The switching TFT Ts is connected to the gate line GL and the data line DL, and the driving TFT Td and the storage capacitor Cst are connected to the switching TFT Ts and the power line PL. The QD light emitting diode D is connected to the driving TFT Td.

In the QD display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the QD light emitting diode D from the power line PL through the driving TFT Td. As a result, the QD light emitting diode D emits light. The storage capacitor Cst serves to maintain the voltage of the gate electrode of the driving TFT Td for one frame. Accordingly, the electroluminescent display device displays images.

Figure 2:
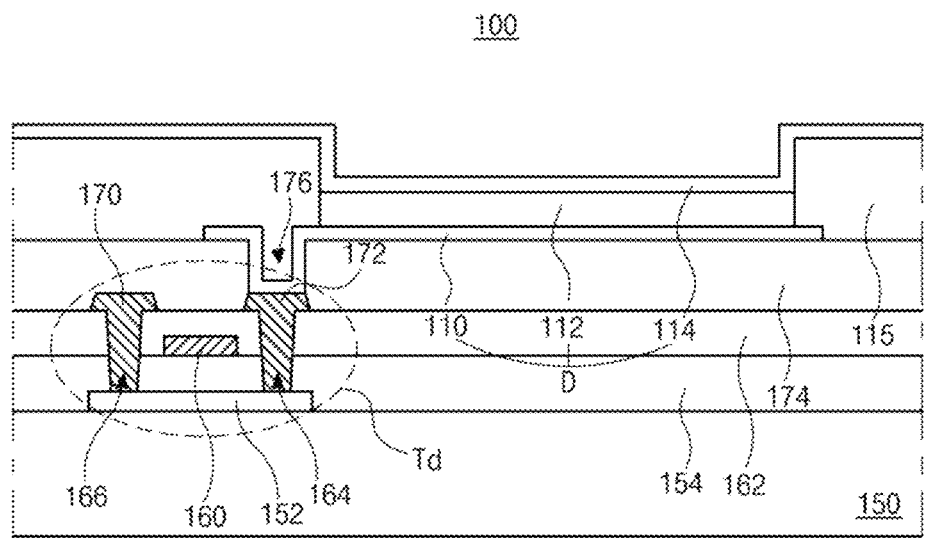
FIG. 2 is a schematic cross-sectional view of a QD light emitting display device of the present disclosure.

FIG. 2 is a schematic cross-sectional view of a QD light emitting display device of the present disclosure.

As shown in FIG. 2, the QD light emitting display device 100 includes a substrate 150, the TFT Td on the substrate 150 and the QD light emitting diode D over the substrate 150 and connected to the TFT Td.

The substrate 150 may be a glass substrate or a flexible substrate of polyimide. The substrate 150 may have a flexible property.

Although not shown, a buffer layer of an inorganic material, e.g., silicon oxide or silicon nitride, may be formed on the substrate 150.

The TFT Td is connected to the switching TFT Ts (of FIG. 1) and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or a poly-silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center of the semiconductor layer 152.

The gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on an entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 166 and 164 exposing both sides of the semiconductor layer 152. The first and second contact holes 166 and 164 are positioned at both sides of the gate electrode 160 to be spaced apart from the gate electrode 160.

The first and second contact holes 166 and 164 extend into the gate insulating layer 154. Alternatively, when the gate insulating layer 154 is patterned to have the same shape as the gate electrode 160, there may be no first and second contact holes 166 and 164 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 166 and 164. The source electrode 170 is connected to the power line PL (of FIG. 1).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may include amorphous silicon.

On the other hand, the switching TFT Ts (of FIG. 1) may have substantially same structure as the TFT Td.

A passivation layer 174, which includes a drain contact hole 176 exposing a part, for example, the drain electrode 172 of the TFT Td, is formed to cover the TFT Td.

A first electrode 110, which is connected to the drain electrode 172 of the TFT Td through the drain contact hole 176, is separately formed on the passivation layer 174 in each pixel region. The first electrode 110 may be an anode and may be formed of a conductive material having a relatively high work function. For example, the first electrode 110 may be formed of a transparent conductive material such as indium-tin-oxide (ITO) or indium-zinc-oxide (IZO).

When the QD display device 100 of the present disclosure is a top-emission type, a reflection electrode or a reflection layer may be formed under the first electrode 110. For example, the reflection electrode or the reflection layer may be formed of aluminum-palladium-copper (APC) alloy.

A bank layer 115, which covers edges of the first electrode 110, is formed on the passivation layer 174. The bank layer 115 exposes a center of the first electrode 110 in the pixel region.

An emitting layer 112 is formed on the first electrode 110. Although not shown, the emitting layer 112 may include a QD emitting material layer (QD EML), in which a QD as an emitting material is included, a hole auxiliary layer under the QD EML, an electron auxiliary layer over the QD EML, and an electron control layer between the QD EML and the electron auxiliary layer.

The hole auxiliary layer may include a hole transporting layer (HTL). The hole auxiliary layer may further include a hole injection layer (HIL) between the HTL and the first electrode 110.

The electron auxiliary layer may include an electron transporting layer (ETL). The electron auxiliary layer may further include an electron injection layer (EIL) between the ETL and a second electrode 114.

The second electrode 114 is formed over the substrate 150, on which the emitting layer 112 is formed. The second electrode 114 is positioned at an entire surface of the display area. The second electrode 114 may be a cathode and may be formed of a conductive material having a relatively low work function. For example, the second electrode 114 may be formed of aluminum (Al), magnesium (Mg) or Al—Mg alloy.

The first electrode 110, the emitting layer 112 and the second electrode 114 constitute the QD light emitting diode D.

In FIG. 2, the first electrode 110 is positioned under the second electrode 114 and is connected to the TFT Td. Alternatively, the second electrode 114 may be positioned under the first electrode 110 and may be connected to the TFT Td.

As will be described below, since the electron control layer, which is capable of controlling the transfer (travel) of the electron, is formed between the QD EML and the ETL, the charge balance in the QD light emitting diode D is improved. Accordingly, the emitting efficiency of the QD light emitting diode D and the QD light emitting display device is improved.

Figure 3:
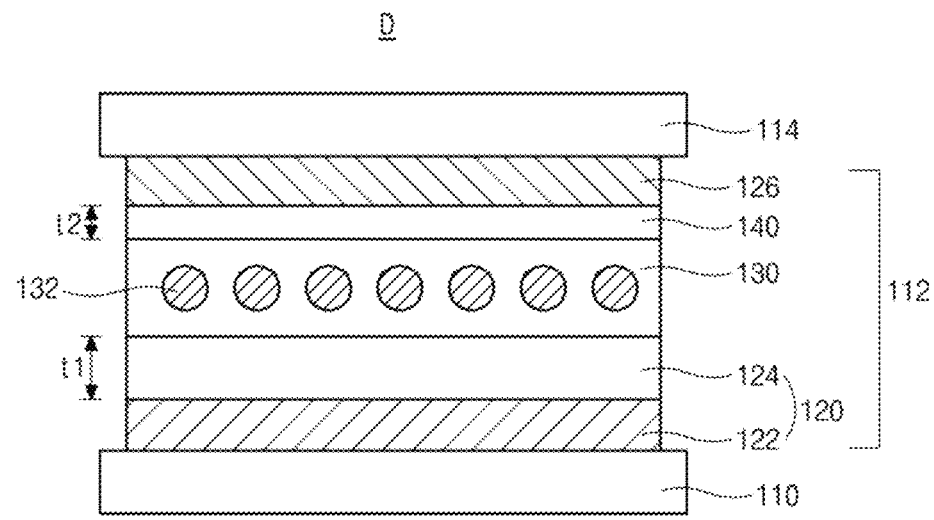
FIG. 3 is a schematic cross-sectional view of a QD light emitting diode according to a first aspect of the present disclosure.

FIG. 3 is a schematic cross-sectional view of a QD light emitting diode according to a first aspect of the present disclosure.

As shown in FIG. 3, the QD light emitting diode D of the present disclosure includes a first electrode 110, a second electrode 114 facing the first electrode 110 and an emitting layer 112 between the first and second electrodes 110 and 114. The emitting layer 112 includes a QD EML 130, a hole auxiliary layer 120 between the first electrode 110 and the QD EML 130, an electron auxiliary layer 126 between the QD EML 130 and the second electrode 114, and an electron control layer 140 between the QD EML 130 and the electron auxiliary layer 126.

The first electrode 110 may be an anode, and the second electrode 114 may be a cathode.

The QD EML 130 includes a plurality of QDs 132. For example, the QD light emitting diode D is positioned in each of a red pixel, a green pixel and a blue pixel, and the QDs 132 in each of the red pixel, the green pixel and the blue pixel are a red QD, a green QD and a blue QD, respectively.

The QD 132 is formed of a semiconductor material. For example, QD 132 may include a core (not shown), which is positioned in a center of the QD 132 and emitting light, a shell (not shown) surrounding (or enclosing) the core and a ligand (not shown) connected to (or combined with) at least a portion of a surface of the shell.

The core and the shell have a difference in an energy bandgap. Each of the core and the shell may include a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The ligand may be C1 to C30 alkyl group. The dispersibility of the QD 132 to a solvent is improved by the ligand such that the QD EML 130 can be formed by a solution process. The ligand may be omitted.

The hole auxiliary layer 120 may include an HTL 124 between the first electrode 110 and the QD EML 130 and an HIL 122 between the first electrode 110 and the HTL 124. The HIL 122 may include a hole injection material, e.g., poly(3,4-ethylenedioxythiophene) polystyrene sulfonate (PEDOT:PSS). The HIL 122 may be omitted.

The electron auxiliary layer 126 is positioned between the QD EML 130 and the second electrode 114. The electron auxiliary layer 126 may include an electron transporting material, e.g., 1,3,5-tris(N-phenylbenzimiazole-2-yl)benzene (TPBi), and may be an ETL.

Although not shown, an EIL, which may include an electron injection material, e.g., LiF, may be further formed between the ETL 126 and the second electrode 114.

The electron control layer 140 has an energy level of a lowest unoccupied molecular orbital (LUMO) being higher than the electron auxiliary layer 126 such that the transfer (travel) of the electron is partially blocked by the electron control layer 140.

The material of the electron control layer 140 has a hole mobility being greater than an electron mobility. Namely, the material of the electron control layer 140 has a hole transporting property (characteristic) and may be a hole transporting material. For example, the electron control layer 140 may include at least one of poly[9,9'-dioctylfluorene-co-N-(4-(3-methylproyl))-diphenylamine] (TFB) and poly(N-vinylcarbazole) (PVK). The material of the electron control layer 140 may be same as or different from a material of the hole auxiliary layer 120, e.g., the HTL 124.

A thickness of the electron control layer 140 may be smaller than that of the hole auxiliary layer 120, e.g., the HTL 124. The HTL 124 may have a first thickness t1, and the electron control layer 140 may have a second thickness t2 being about ⅕ to ½ of the first thickness t1. For example, the HTL 124 may have a thickness of about 20 nm, and the electron control layer 140 may have a thickness of about 2 to 10 nm.

Figure 4:
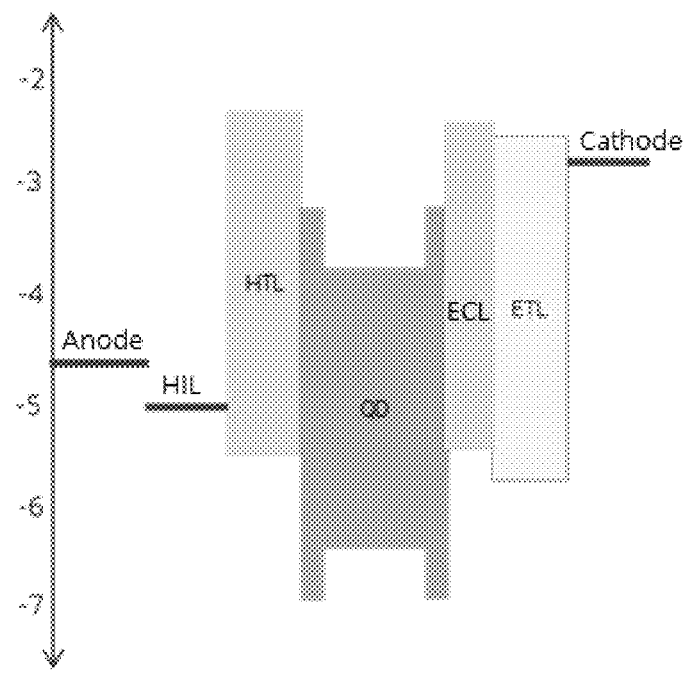
FIG. 4 is a schematic view illustrating an energy band diagram in a QD light emitting diode of the present disclosure.

Referring to FIG. 4, which is a schematic view illustrating an energy band diagram in a QD light emitting diode of the present disclosure, the energy level of the LUMO of the electron control layer (ECL) is higher than that of the electron transporting layer (ETL) such that the electron transfer is partially blocked by the electron control layer (ECL).

In the related art QD light emitting diode without the electron control layer, since an energy level of a HOMO (or a valance band) of the QD EML is low and a difference between an energy level of the HOMO of the HTL and the energy level of the HOMO of the QD EML is great, a hole injection rate (velocity) is slower than an electron injection rate. Accordingly, a charge balance in the QD EML is degraded (or destroyed).

However, in the QD light emitting diode D of the present disclosure, since the electron control layer ECL, which has an energy level of a LUMO higher than the ETL and is capable of control the electron transfer (injection), is disposed between the QD EML and the ETL, the charge balance in the QD EML is improved. Accordingly, the emitting efficiency of the QD light emitting diode D and the QD light emitting display device is improved.

QD Light Emitting Diode

1. Comparative Example (Ref)

A first electrode (ITO, 50 nm), an HIL (PEDOT:PSS, 45 nm), an HTL (TFB, 20 nm), a QD EML (InP/ZnS, 20 nm), an ETL (TPBi, 35 nm), an EIL (LiF, 1.2 nm) and a second electrode (Al, 80 nm) are sequentially stacked to form a QD light emitting diode.

2. Example 1 (Ex1)

In addition to the QD light emitting diode of Comparative Example, an electron control layer (TFB, 4 nm) is further formed between the QD EML and the ETL.

3. Example 2 (Ex2)

In addition to the QD light emitting diode of Comparative Example, an electron control layer (TFB, 6 nm) is further formed between the QD EML and the ETL.

Figure 5:
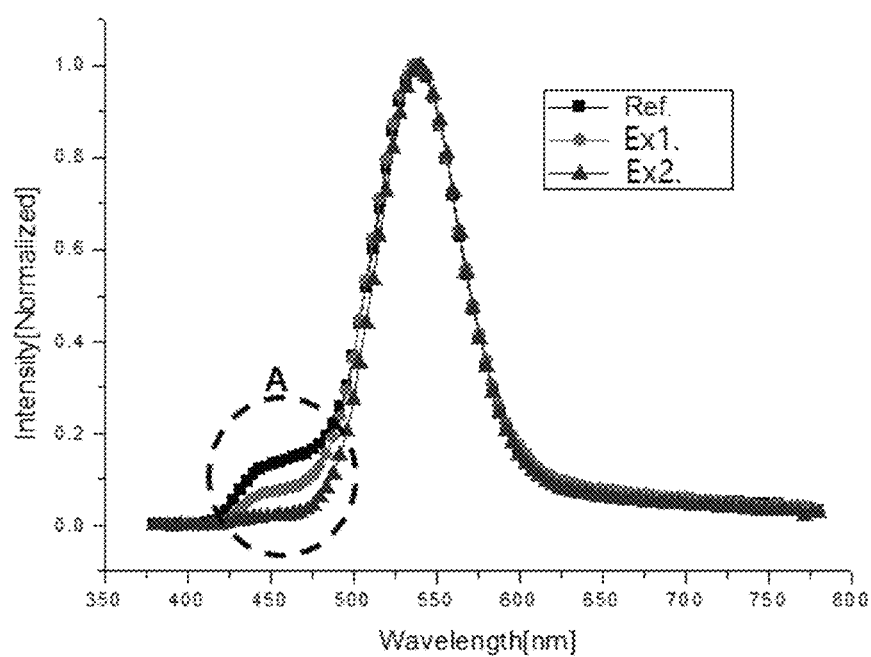
FIG. 5 is a graph showing an EL spectrum of a QD light emitting diode.

Emission properties, e.g., a quantum efficiency (EQE), brightness and a full width at half maximum (FWHM), of the QD light emitting diode in Comparative Example and Examples 1 and 2 are measured and listed in Table 1. In addition, a normalized intensity of EL spectrum of the QD light emitting diodes is shown in FIG. 5.

TABLE 1

|     | EQE [%] | Brightness [nit] | FWHM [nm] |
|-----|---------|------------------|-----------|
| Ref | 1.03    | 105              | 64        |
| Ex1 | 1.35    | 309              | 64        |
| Ex2 | 1.46    | 360              | 64        |

As shown in Table 1, in comparison to the QD light emitting diode of Comparative Example, which does not include an electron control layer, the QD light emitting diode of Examples 1 and 2 has high quantum efficiency and brightness. Namely, since the electron transfer is partially blocked by the electron control layer, the charge balance and the emitting property in the QD light emitting diode D are improved.

In addition, as shown in FIG. 5, in the QD light emitting diode of Comparative Example, the electron injection (or transporting) rate is faster than the hole injection rate such that the combination of the hole and the electron is generated in a part of the HTL. As a result, an emission peak of a material of the HTL, i.e., TFB, is detected.

However, in the QD light emitting diode of Examples 1 and 2, which include the electron control layer, the emission peak of the material of the HTL is reduced. In addition, in the QD light emitting diode of Example 2, in which the electron control layer has a relatively large thickness (6 nm), the emission peak of the material of the HTL is not detected.

Figure 6:
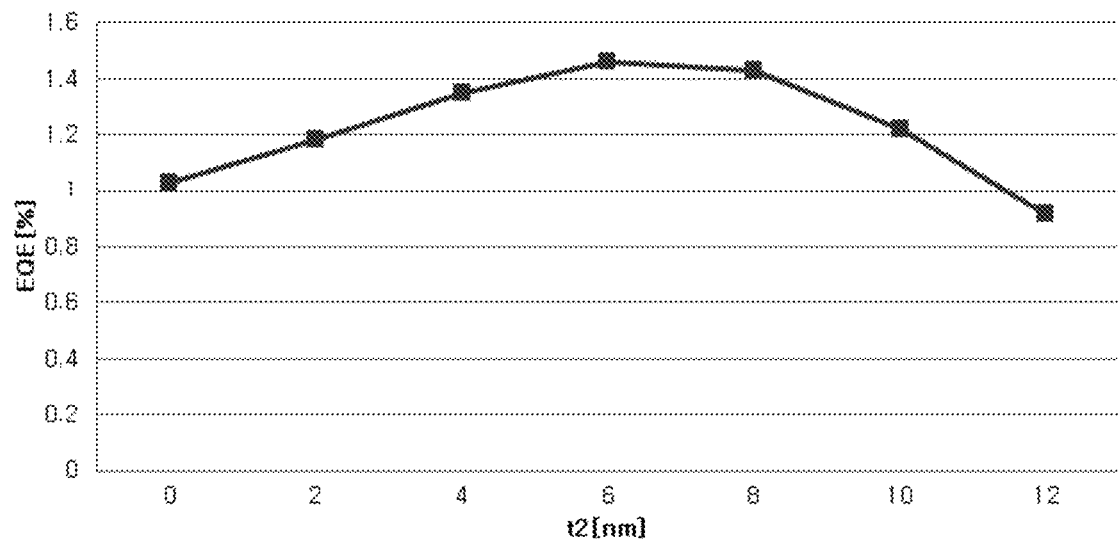
FIG. 6 is a graph showing a quantum efficiency of a QD light emitting diode according to a thickness of an electron control layer.

A thickness of the electron control layer in the QD light emitting diode of Example 1 is changed, and the quantum efficiency of the QD light emitting diodes is measured and shown in FIG. 6.

As shown in FIG. 6, in a thickness less than about 6 nm, the quantum efficiency is increased when the thickness of the electron control layer is increased. However, in a thickness more than about 6 nm, the quantum efficiency is decreased when the thickness of the electron control layer is increased. In the QD light emitting diode D of the present disclosure, a thickness of the electron control layer may have a range of about 2 to 10 nm. The second thickness t2, e.g., about 2 to 10 nm, of the electron control layer may be about ⅕ to ½ of the first thickness t1, e.g., about 20 nm, of the HTL.

When the thickness of the electron control layer is smaller than the above range, the electron blocking property by the electron control layer is insufficiently provided. When the thickness of the electron control layer is greater than the above range, the hole injection rate may be faster than the electron injection rate such that the charge balance is degraded.

Figure 7:
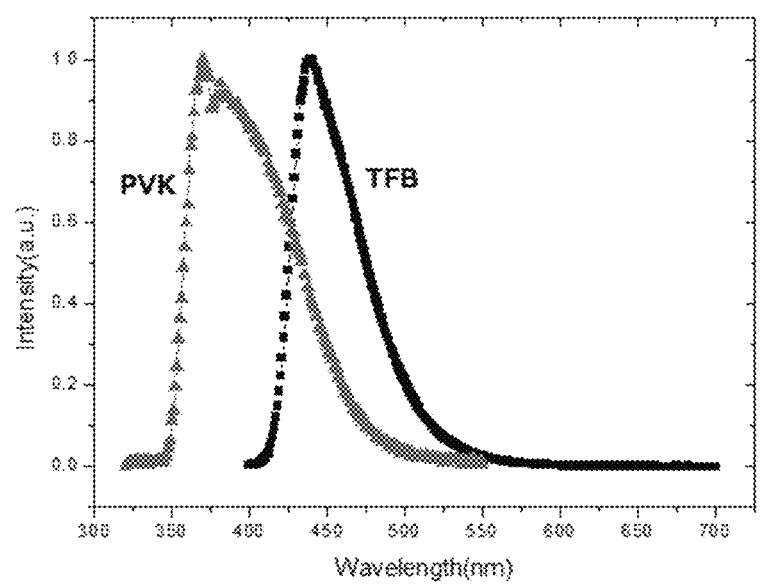
FIG. 7 is a graph showing a PL spectrum of a material of a hole transporting layer and a material of an electron control layer.

The hole mobility of the electron control layer 140 may be smaller than that of the HTL 124, and an energy bandgap of the electron control layer 140 may be greater than that of the HTL 124. For example, the HTL 124 may include TFB, and the electron control layer 140 may include PVK. Properties of TFB and PVK are listed in Table 2, and the PL spectrum of TFB and PVK is shown in FIG. 7.

TABLE 2

|     | Hole mobility | Bandgap | LUMO | HOMO |
|-----|---------------|---------|------|------|
| TFB | $1*10^{-2}$ $cm^2$ $V^{-1}$ $s^{-1}$ | 3.24 eV | −2.11 eV | −5.25 eV |
| PVK | $1*10^{-5}$ $cm^2$ $V^{-1}$ $s^{-1}$ | 3.30 eV | −2.2 eV | −5.3 eV |

As shown in Table 2, TFB has the hole mobility being greater than PVK. Accordingly, when the HTL includes TFB, the hole mobility from the first electrode 110 into the QD EML 130 is improved. On the other hand, PVK has the energy bandgap being greater than TFB. As a result, PVK can emit light having a wavelength shorter than TFB.

In the QD light emitting diode D of the present disclosure, since the HTL 124 includes a hole transporting material having a relatively high hole mobility and the electron control layer 140 includes a hole transporting material having a relative wide energy bandgap, the hole injection property and the quantum efficiency are improved.

Namely, when the electron control layer 140 includes a hole transporting material, the charge may be leaked into the electron control layer 140 such that the emission is provided from the electron control layer 140. However, in the QD light emitting diode D of the present disclosure, since the hole transporting material of the electron control layer 140 has a wide energy bandgap and emits short wavelength range light, the light emitted from the electron control layer 140 is absorbed by the QD 132 in the QD EML 130. Then, the QD 132 emits a pre-determined wavelength range light. In other words, in the QD light emitting diode D of the present disclosure, the emission wavelength range (or emission peak) of the hole transporting material in the electron control layer 140 is within an absorption wavelength range (or absorption peak) of the QD 132 in the QD EML 130.

Accordingly, the quantum efficiency of the QD light emitting diode D is improved.

To increase re-emission of the QD 132 without leakage of the light emitted from the electron control layer 140, the second electrode 114 and the first electrode 110 may be a reflective electrode and a transparent electrode, respectively. Namely, the light from the QD EML 130 passes through the first electrode 110.

QD Light Emitting Diode

1. Example 3

A first electrode (ITO, 50 nm), an HIL (PEDOT:PSS, 45 nm), an HTL (TFB, 20 nm), a QD EML (InP/ZnS, 20 nm), an electron control layer (TFB, 6 nm), an ETL (TPBi, 35 nm), an EIL (LiF, 1.2 nm) and a second electrode (Al, 80 nm) are sequentially stacked to form a QD light emitting diode.

2. Example 4

PVK instead of TFB in Example 3 is used to form the electron control layer.

3. Example 5

PVK instead of TFB in Example 3 is used to form the HTL.

4. Example 6

PVK instead of TFB in Example 3 is used to form the HTL and the electron control layer.

The quantum efficiency of the QD light emitting diode in Examples 3 to 6 is measured and listed in Table 3.

TABLE 3

| HTL | ECL | EQE[%] |
| --- | --- | --- |
| TFB(20 nm) | TFB(6 nm) | 1.46 |
| TFB(20 nm) | PVK(6 nm) | 1.68 |
| PVK(20 nm) | TFB(6 nm) | 0.86 |
| PVK(20 nm) | PVK(6 nm) | 1.01 |

As shown in Table 3, the quantum efficiency of the QD light emitting diode of Example 4, where TFB having high hole mobility is included in the HTL and PVK having wide energy bandgap is included in the electron control layer, is significantly improved.

Figure 8:
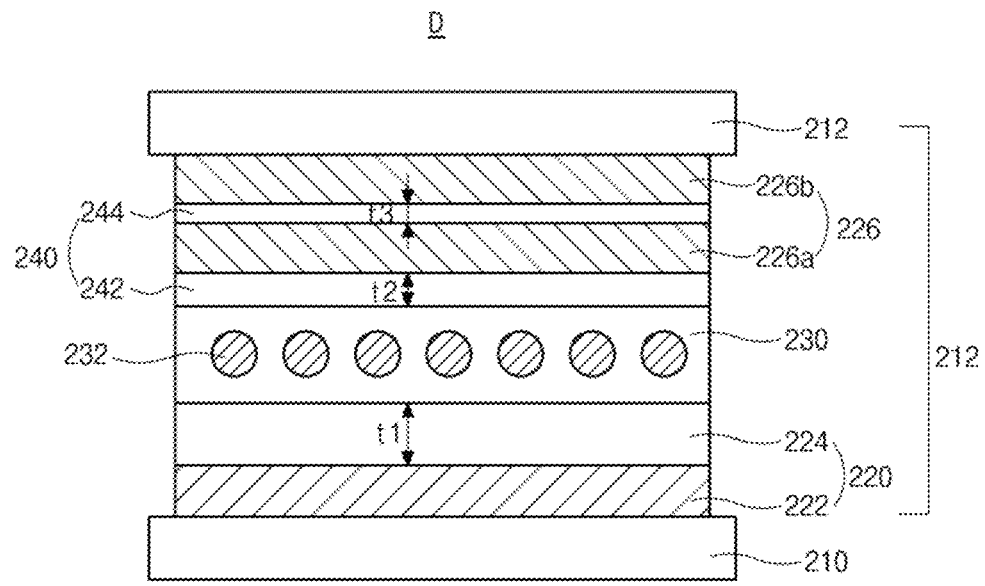
FIG. 8 is a schematic cross-sectional view of a QD light emitting diode according to a second aspect of the present disclosure.

FIG. 8 is a schematic cross-sectional view of a QD light emitting diode according to a second aspect of the present disclosure.

As shown in FIG. 8, the QD light emitting diode D of the present disclosure includes a first electrode 210, a second electrode 214 facing the first electrode 210 and an emitting layer 212 between the first and second electrodes 210 and 214. The emitting layer 212 includes a QD EML 230, a hole auxiliary layer 220 between the first electrode 210 and the QD EML 230, an electron auxiliary layer 226 between the QD EML 230 and the second electrode 214, and an electron control layer 240 between the QD EML 230 and the electron auxiliary layer 226. The electron auxiliary layer 226 includes first and second electron auxiliary layer 226a and 226b, and the electron control layer 240 includes first and second electron control layers 242 and 244.

The first electron control layer 242 is positioned between the QD EML 230 and the first electron auxiliary layer 226a, and the second electron control layer 244 is positioned between the first and second electron auxiliary layers 226a and 226b.

The first electrode 110 may be an anode, and the second electrode 114 may be a cathode. The first electrode 210 may be a transparent electrode, and the second electrode 214 may be a reflective electrode. The first electrode 210 may be positioned between the second electrode 214 and the substrate 150 (of FIG. 2) and connected to the TFT Td (of FIG. 2). Alternatively, the second electrode 214 may be positioned between the first electrode 210 and the substrate 150 and connected to the TFT Td.

The QD EML 230 includes a plurality of QDs 232. For example, the QD light emitting diode D is positioned in each of a red pixel, a green pixel and a blue pixel, and the QDs 232 in each of the red pixel, the green pixel and the blue pixel are a red QD, a green QD and a blue QD, respectively.

The QD 232 is formed of a semiconductor material. For example, QD 232 may include a core (not shown), which is positioned in a center of the QD 232 and emitting light, a shell (not shown) surrounding (or enclosing) the core and a ligand (not shown) connected to (or combined with) at least a portion of a surface of the shell.

The core and the shell have a difference in an energy bandgap. Each of the core and the shell may include a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The ligand may be C1 to C30 alkyl group. The dispersibility of the QD 232 to a solvent is improved by the ligand such that the QD EML 230 can be formed by a solution process. The ligand may be omitted.

The hole auxiliary layer 220 may include an HTL 224 between the first electrode 210 and the QD EML 230 and an HIL 222 between the first electrode 210 and the HTL 224. The HIL 222 may include a hole injection material, e.g., PEDOT:PSS. The HIL 222 may be omitted.

The first electron auxiliary layer 226a is positioned between the QD EML 230 and the second electrode 214, and the second electron auxiliary layer 226b is positioned between the first electron auxiliary layer 226a and the second electrode 214. Each of the first and second electron auxiliary layers 226a and 226b may include an electron transporting material, e.g., TFB. Each of the first and second electron auxiliary layers 226a and 226b may be an ETL.

Although not shown, an EIL, which may include an electron injection material, e.g., LiF, may be further formed between the second electron auxiliary layer 226b and the second electrode 214.

The first electron control layer 242 is positioned between the QD EML and the first electron auxiliary layer 226a, and the second electron control layer 244 is positioned between the first and second electron auxiliary layers 226a and 226b. Namely, the electron control layer 240 and the electron auxiliary layer 226 may be alternately stacked on the QD EML 230.

The electron control layer 240 has an energy level of a LUMO being higher than the electron auxiliary layer 226 such that the transfer (travel) of the electron is partially blocked by the electron control layer 240.

The material of each of the first and second electron control layers 242 and 244 has a hole mobility being greater than an electron mobility. Namely, the material of each of the first and second electron control layers 242 and 244 has a hole transporting property (characteristic) and may be a hole transporting material. For example, each of the first and second electron control layers 242 and 244 may independently include at least one of poly[9,9'-dioctylfluorene-co-N-(4-(3-methylproyl))-diphenylamine] (TFB) and poly(N-vinylcarbazole) (PVK). The material of each of the first and second electron control layers 242 and 244 may be same as or different from a material of the hole auxiliary layer 220, e.g., the HTL 224.

A thickness of each of the first and second electron control layers 242 and 244 may be smaller than that of the hole auxiliary layer 220, e.g., the HTL 224. The HTL 224 may have a first thickness t1, the first electron control layer 242 may have a second thickness t2 being about ⅕ to ½ of the first thickness t1, and the second control layer 244 may have a third thickness t3 being equal to or smaller than the second thickness.

As mentioned above, in the QD light emitting diode D of the present disclosure, since the electron control layer 240, which has an energy level of a LUMO higher than the electron auxiliary layer 226, which may be an ETL, and is capable of control the electron transfer (injection), is disposed between the QD EML 230 and the electron auxiliary layer 226, the charge balance in the QD EML is improved. Accordingly, the emitting efficiency of the QD light emitting diode D and the QD light emitting display device 100 is improved.

The hole mobility of each of the first and second electron control layers 242 and 244 may be smaller than that of the HTL 224, and an energy bandgap of each of the first and second electron control layers 242 and 244 may be greater than that of the HTL 224. For example, the HTL 224 may include TFB, and each of the first and second electron control layers 242 and 244 may include PVK. As a result, the hole injection property and the quantum efficiency of the QD light emitting diode D are improved.

In addition, since the material, e.g., PVK, of the electron control layer 240 and the material, e.g., TPBi, of the electron auxiliary layer 226 have a difference in a refractive index, the quantum efficiency of the QD light emitting diode D is further improved when the electron control layer 240 and the electron auxiliary layer 226 are alternately arranged.

QD Light Emitting Diode

1. Example 7 (Ex7)

A first electrode (ITO, 50 nm), an HIL (PEDOT:PSS, 45 nm), an HTL (TFB, 20 nm), a QD EML (InP/ZnS, 20 nm), a first electron control layer (PVK, 6 nm), a first ETL (TPBi, 15 nm), a second electron control layer (PVK, 3 nm), a second ETL (TPBi, 15 nm), an EIL (LiF, 1.2 nm) and a second electrode (Al, 80 nm) are sequentially stacked to form a QD light emitting diode.

2. Example 8 (Ex8)

In Example 7, the thickness of the second electron control layer is changed into 6 nm.

3. Example 9 (Ex9)

In Example 7, the thickness of the second electron control layer is changed into 10 nm.

4. Example 10 (Ex10)

In Example 7, the thickness of the second electron control layer is changed into 15 nm.

The quantum efficiency of the QD light emitting diode in Comparative Example (Ref), Example 4 (Ex4) and Examples 7 to 10 is measured and listed in Table 4.

TABLE 4

|  | EQE [%] |
| --- | --- |
| Ref | 1.03% |
| Ex4 | 1.68% |
| Ex7 | 1.83% |
| Ex8 | 1.41% |
| Ex9 | 1.11% |
| Ex10 | 0.89% |

As shown in Table 4, in the QD light emitting diode includes the first electron control layer and the second electron control layer, which has a thickness being equal to or smaller than the first electron control layer, the quantum efficiency is significantly improved. In addition, when the thickness of the second electron control layer is smaller than that of the first electron control layer, the quantum efficiency is further improved.

As mentioned above, in the QD light emitting diode, since the electron control layer including a hole transporting material is provided between the QD EML and the hole auxiliary layer, i.e., HTL, the charge balance of the QD light emitting diode and the QD light emitting display device is improved. As a result, the emitting efficiency of the QD light emitting diode and the QD light emitting display device is improved.

In addition, since the electron control layer has an energy bandgap being wider than the HTL, the emitting efficiency of the QD light emitting diode and the QD light emitting display device is further improved.

Moreover, since the electron control layer has a thickness being smaller than the HTL, the emitting efficiency of the QD light emitting diode and the QD light emitting display device is further improved.

Furthermore, since the electron control layer and the electron auxiliary layer, i.e., the ETL, are alternately arranged on the QD EML, the emitting efficiency of the QD light emitting diode and the QD light emitting display device is further improved.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A quantum-dot (QD) light emitting diode, comprising:
a first electrode;
a second electrode facing the first electrode;
a QD emitting material layer between the first and second electrodes and including a QD;
a hole transporting layer disposed between the first electrode and the QD emitting material layer and including a first hole transporting material;
a first electron transporting layer disposed between the QD emitting material layer and the second electrode; and
a first electron control layer disposed between the QD emitting material layer and the first electron transporting layer and including a second hole transporting material,
wherein the first hole transporting material has a first energy bandgap, and the second hole transporting material has a second energy bandgap that is wider than the first energy bandgap.

2. The QD light emitting diode according to claim 1, wherein the first hole transporting material has a first hole mobility, and the second hole transporting material has a second hole mobility that is smaller than the first hole mobility.

3. The QD light emitting diode according to claim 1, wherein the first electrode includes a transparent electrode, and the second electrode includes a reflective electrode.

4. The QD light emitting diode according to claim 1, wherein the second hole transporting material has an emission wavelength range that is within an absorption wavelength range of the QD.

5. The QD light emitting diode according to claim 1, wherein the first hole transporting material includes poly[9,9'-dioctylfluorene-co-N-(4-(3-methylproyl))-diphenylamine] (TFB), and the second hole transporting material includes poly(N-vinylcarbazole) (PVK).

6. The QD light emitting diode according to claim 1, wherein the hole transporting layer has a first thickness, and the first electron control layer has a second thickness that is smaller than the first thickness.

7. The QD light emitting diode according to claim 6, wherein the second thickness is ⅕ to ½ of the first thickness.

8. The QD light emitting diode according to claim 1, further comprising:
   a second electron control layer disposed between the first electron transporting layer and the second electrode and including the second hole transporting material; and
   a second electron transporting layer disposed between the second electron control layer and the second electrode.

9. The QD light emitting diode according to claim 8, wherein a thickness of the second electron control layer is equal to or smaller than a thickness of the first electron control layer.

10. The QD light emitting diode according to claim 1, further comprising an electron injection layer disposed between the first electron transporting layer and the second electrode.

11. A quantum-dot (QD) light emitting display device, comprising:
   a substrate;
   a QD light emitting diode disposed over the substrate, the QD light emitting diode comprising:
      a first electrode;
      a second electrode facing the first electrode;
      a QD emitting material layer disposed between the first and second electrodes and including a QD;
      a hole transporting layer disposed between the first electrode and the QD emitting material layer and including a first hole transporting material;
      a first electron transporting layer disposed between the QD emitting material layer and the second electrode; and
      a first electron control layer disposed between the QD emitting material layer and the first electron transporting layer and including a second hole transporting material; and
   a thin film transistor disposed between the substrate and the QD light emitting diode and connected to the QD light emitting diode,
   wherein the first hole transporting material has a first energy bandgap, and the second hole transporting material has a second energy bandgap that is wider than the first energy bandgap.

12. The QD light emitting display device according to claim 11, wherein the first hole transporting material has a first hole mobility, and the second hole transporting material has a second hole mobility that is smaller than the first hole mobility.

13. The QD light emitting display device according to claim 11, wherein the first electrode is a transparent electrode, and the second electrode is a reflective electrode.

14. The QD light emitting display device according to claim 11, wherein the second hole transporting material has an emission wavelength range that is within an absorption wavelength range of the QD.

15. The QD light emitting display device according to claim 11, wherein the first hole transporting material includes poly[9,9'-dioctylfluorene-co-N-(4-(3-methylproyl))-diphenylamine] (TFB), and the second hole transporting material includes poly(N-vinylcarbazole) (PVK).

16. The QD light emitting display device according to claim 11, wherein the hole transporting layer has a first thickness, and the first electron control layer has a second thickness that is smaller than the first thickness.

17. The QD light emitting display device according to claim 16, wherein the second thickness is ⅕ to ½ of the first thickness.

18. The QD light emitting display device according to claim 11, wherein the QD light emitting diode further comprises:
   a second electron control layer disposed between the first electron transporting layer and the second electrode and including the second hole transporting material; and
   a second electron transporting layer disposed between the second electron control layer and the second electrode.

19. The QD light emitting display device according to claim 18, wherein a thickness of the second electron control layer is equal to or smaller than a thickness of the first electron control layer.

20. The QD light emitting display device according to claim 11, further comprising an electron injection layer disposed between the first electron transporting layer and the second electrode.

* * * * *